United States Patent
Heima et al.

[11] Patent Number: 5,834,960
[45] Date of Patent: Nov. 10, 1998

[54] SEMICONDUCTOR DEVICE

[75] Inventors: Tetsuya Heima; Norio Higashisaka; Akira Ohta, all of Tokyo, Japan

[73] Assignee: Mitsubishi Denki Kabushiki Kaisha, Tokyo, Japan

[21] Appl. No.: 880,767

[22] Filed: Jun. 23, 1997

[30] Foreign Application Priority Data

Jan. 30, 1997 [JP] Japan ..................................... 9-016915

[51] Int. Cl.[6] ................................................. H03K 5/13
[52] U.S. Cl. ........................................... 327/276; 327/277
[58] Field of Search .................................. 327/261, 262, 327/263, 269, 270, 276, 278, 231, 237, 250

[56] References Cited

U.S. PATENT DOCUMENTS 5,317,202  5/1994  Waizman ................................. 327/261
5,699,003  12/1997  Saeki ....................................... 327/261

FOREIGN PATENT DOCUMENTS 1295518  11/1989  Japan .
4277921  10/1992  Japan .
  613857   1/1994  Japan .

OTHER PUBLICATIONS

"Testabe Digital Delay Line", IBM Technical Disclosure Bulletin, vol. 38, No. 03, Mar. 1995, pp. 85–86.

*Primary Examiner*—Tuan T. Lam
*Attorney, Agent, or Firm*—Leydig, Voit & Mayer

[57] ABSTRACT

A semiconductor device includes an input terminal and an output terminal; a delay circuit including N (N=integer) unit delay circuits connected in series between the input terminal and the output terminal, earn unit delay circuit including first and second two-input NOR or NAND circuits connected in series, the second two-input NOR or NAND circuit being nearer to the output terminal than the first two-input NOR or NAND circuit, a first input of each first two-input NOR or NAND circuit being connected to the input terminal, and an output of each first two-input NOR or NAND circuit being connected to a first input of the second two-input NOR or NAND circuit of each unit delay circuit; and a control circuit outputting individual control signals, each control signal being applied to a respective second input of the second two-input NOR or NAND circuit included in each unit delay circuit, wherein delay time in signal transmission from the input terminal to the output terminal varies in response to the control signals. The number of elements per unit resolution is reduced, and variations in the delay time are reduced by the reduced element number so the linearity of the delay circuit is improved. Further, the layout is simplified as compared with the conventional delay circuit.

11 Claims, 8 Drawing Sheets

Fig.10 (a) (Prior Art)
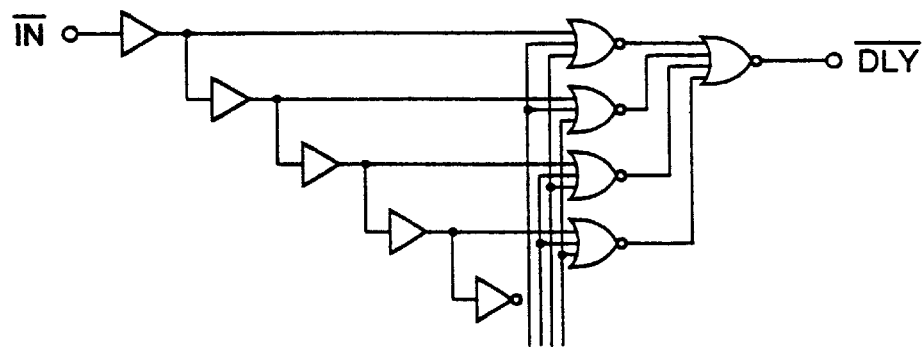
Fig.10 (b) (Prior Art)
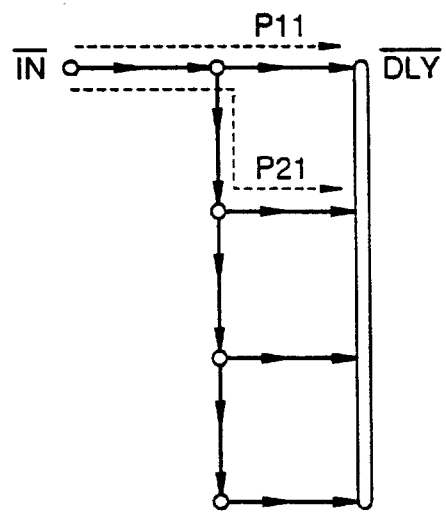
Fig.10 (c) (Prior Art)
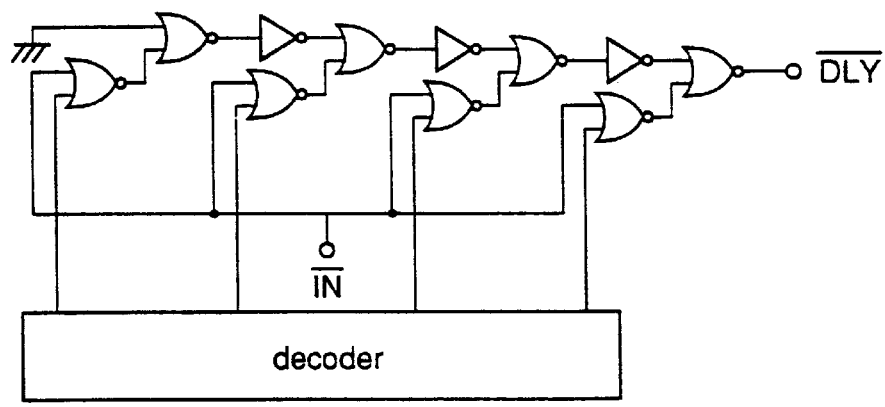
Fig.10 (d) (Prior Art)
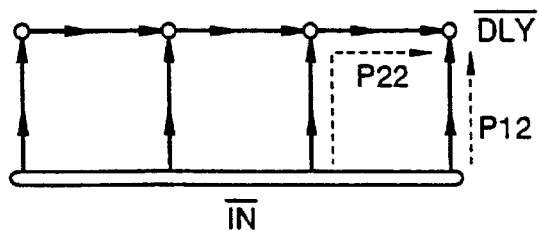

SEMICONDUCTOR DEVICE

FIELD OF THE INVENTION

The present invention relates to semiconductor devices and, more particularly, to a variable delay circuit that gives an arbitrary output delay time to an input signal, in accordance with a control signal.

BACKGROUND OF THE INVENTION

In a variable delay circuit using a selector, the linearity of delay time, i.e., the proportionality of variation in delay time to the number of theoretical stages, is not good because of a difference in wiring lengths running parallel to each other in the selector unit or variations in gate delay. A conventional method for reducing such a difference in wiring lengths is disclosed in, for example, Japanese Published Patent Application No. Hei. 6-13857. FIG. 10(*a*) is a logical circuit diagram illustrating a conventional variable delay circuit using a selector, and delay paths in the variable delay circuit are schematically shown in FIG. 10(*b*). FIG. 10(*c*) is a diagram illustrating an improved variable delay circuit disclosed in the above-mentioned publication using basic gates, and delay paths in the variable delay circuit are schematically illustrated in FIG. 10(*d*). In the respective schematic views, arrows show delays due to the device, and circles and ellipses show the wiring. However, a delay due to the wiring is not considered in the schematic views.

In the variable delay circuit shown in FIG. 10(*a*), a path with the shortest delay time (P11) is illustrated with four arrows, and a path with the next shortest delay time (P21) is illustrated with six arrows. In the variable delay circuit shown in FIG. 10(*c*), a path with the shortest delay time (P12) is illustrated with two arrows, and a path with the next shortest delay time (P22) is illustrated with four arrows.

When the variable delay circuit is constructed as shown in FIG. 10(*c*), degradation in the delay time linearity due to the wiring is reduced to some extent, as compared with the circuit shown in FIG. 10(*a*).

In both of the variable delay circuits, however, the paths P11 and P12 having the shortest delay times run completely parallel with the paths P21 and P22 having the next shortest delay times, respectively, i.e., the paths P11 and P12 do not share the lines with the paths P21 and P22, respectively. Therefore, when a variation in delay time due to each element is Δt, a variation per unit resolution is six times as large as Δ(6×Δ), and this variation is an obstacle to improvement of resolution or yield, and improvement of linearity of delay characteristics.

In the conventional variable delay circuit so constructed, since variations in delay amounts due to delay stages are controlled in completely separated paths, the variation in delay time per unit resolution is considerable, and the linearity of delay characteristics as a circuit is degraded with an increase in the number of the delay stages.

SUMMARY OF THE INVENTION

It is an object of the present invention to provide a semiconductor device having an improved linearity as a delay circuit.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device comprises an input terminal and an output terminal; a delay circuit comprising N (=integer) unit delay circuits connected in series between the input terminal and the output terminal, each unit delay circuit comprising first and second two-input NOR circuits connected in series, the second two-input NOR circuit being nearer to the output terminal than the first two-input NOR circuit, and one of two inputs of the first two-input NOR circuit being connected to the input terminal; and a control circuit outputting individual control signals, each control signal being applied to one of two inputs of the second two-input NOR circuit included in each unit delay circuit; wherein a delay time in signal transmission from the input terminal to the output terminal is varied by the control signals. Therefore, the number of elements per unit resolution is reduced, and variations in the delay time are reduced by the reduced element number, whereby the linearity as a delay circuit is improved. Further, the layout is simplified as compared with the conventional one.

According to a second aspect of the present invention, a semiconductor device comprises an input terminal and an output terminal; a delay circuit comprising N (=integer) unit delay circuits connected in series between the input terminal and the output terminal, each unit delay circuit comprising first and second two-input NAND circuits connected in series, the second two-input NAND circuit being nearer to the output terminal than the first two-input NAND circuit, and one of two inputs of the first two-input NAND circuit being connected to the input terminal; and a control circuit outputting individual control signals, each control signal being applied to one of two inputs of the second two-input NAND circuit included in each unit delay circuit; wherein a delay time in signal transmission from the input terminal to the output terminal is varied by the control signals. Therefore, the number of elements per unit resolution is reduced, and variations in the delay time are reduced by the reduced element number, whereby the linearity as a delay circuit is improved. Further, the layout is simplified as compared with the conventional one.

According to a third aspect of the present invention, in the above-mentioned semiconductor device, a delay element is inserted in a signal transmission path between the inputs of the first two-input NOR circuits of adjacent unit delay circuits, which inputs are connected to the input terminal; and an input signal from the input terminal is applied to the unit delay circuits connected in series, from one nearest to the output terminal toward one most distant from the output terminal, whereby the width of delay time due to the unit delay circuits is increased. Therefore, regardless of the resolution of the unit delay circuit, a variable delay circuit having a resolution lower than the resolution of the unit delay circuit is realized.

According to a fourth aspect of the present invention, in the above-mentioned semiconductor device, a delay element is inserted in a signal transmission path between the inputs of the first two-input NOR circuits of adjacent unit delay circuits, which inputs are connected to the input terminal; and an input signal from the input terminal is applied to the unit delay circuits connected in series, from one most distant from the output terminal toward one nearest to the output terminal, whereby the width of delay time due to the unit delay circuits is decreased. Therefore, regardless of the resolution of the unit delay circuit, a variable delay circuit having a resolution lower than the resolution of the unit delay circuit is realized.

According to a fifth aspect of the present invention, in the above-mentioned semiconductor device, each two-input NOR circuit is constituted using direct coupled FET logic (DCFL). Therefore, the power consumption is reduced.

According to a sixth aspect of the present invention, in the above-mentioned semiconductor device, each two-input NOR circuit or each two-input NAND circuit is constituted by either of an N-channel MOS circuit and a complementary MOS circuit. Therefore, this is applicable to an ordinary silicon device.

According to a seventh aspect of the present invention, in the above-mentioned semiconductor device, cells of the two-input NOR circuits or the two-input NAND circuits connected in series are arranged adjacent to each other in a line to constitute the delay circuit. Therefore, the area of the elements constituting the logical circuit is reduced.

According to an eighth aspect of the present invention, a semiconductor device comprises an input terminal and an output terminal; a delay circuit comprising N (=integer) unit delay circuits connected in series between the input terminal and the output terminal, each unit delay circuit comprising a two-input NOR circuit, a first three-input NOR circuit, and a second three-input NOR circuit being connected so that an input of the two-input NOR circuit and an input of the first three-input NOR circuit are connected to the input terminal while output terminals of the two-input NOR circuit and the first three-input NOR circuit are respectively connected to two inputs of the second three-input NOR circuit, and the unit delay circuits being connected so that an output of the second three-input NOR circuit in the previous one is connected to the other input of the two-input NOR circuit and one of remaining two inputs of the first three-input NOR circuit in the subsequent one; and a control circuit outputting individual control signals, each control signal being applied to remaining one input of the second three-input NOR circuit of each unit delay circuit; wherein a delay time in signal transmission from the input terminal to the output terminal is varied by the control signals, and a delay time due to each unit delay circuit is varied by an adjusting signal which is input to remaining one input of the first three-input NOR circuit of each unit delay circuit, whereby resolution of the delay circuit is varied. Therefore, even when the elements constituting the variable delay circuit vary, these variations can be adjusted by the adjusting signal supplied from the outside, whereby the production yield of the variable delay circuit is improved.

According to a ninth aspect of the present invention, the above-mentioned semiconductor device further comprises a pulse width formation means connected to the output terminal and making the pulse width of the delay output from the output terminal uniform. Therefore, regardless of the number of delay stages, the pulse width of the output signal is made uniform, resulting in a stable output.

BRIEF DESCRIPTION OF THE DRAWINGS

FIG. 10(a)–10(d) are diagrams illustrating conventional variable delay circuits.

DETAILED DESCRIPTION OF THE PREFERRED EMBODIMENTS

Embodiment 1

Figure 1:
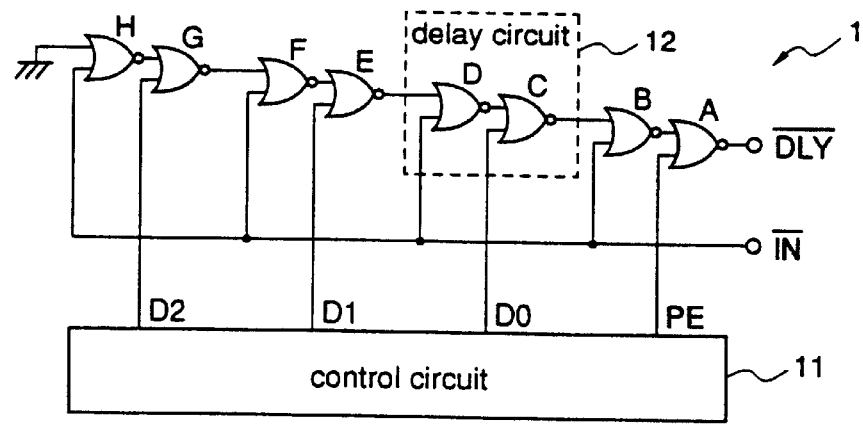
FIG. 1(a) is a logical circuit diagram illustrating a variable delay circuit as a semiconductor device according to a first embodiment of the invention.
FIG. 1(b) is a schematic diagram illustrating delay paths in the variable delay circuit.
FIG. 1(c) is a diagram showing waveforms of an input signal and a delay output.
Figure 1:
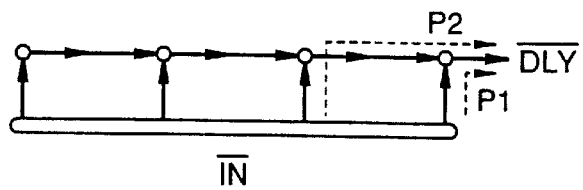
Figure 1:
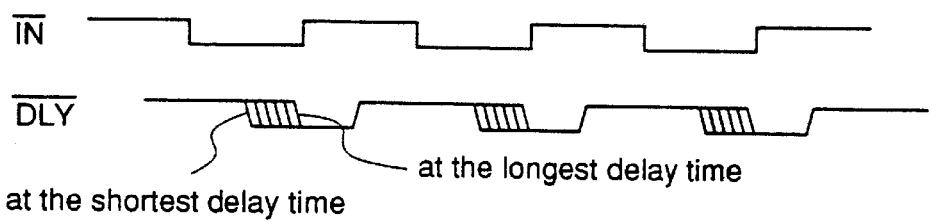

FIG. 1(a) is a logical circuit diagram illustrating a variable delay circuit as a semiconductor circuit according to a first embodiment of the present invention, and FIG. 1(b) is a diagram schematically illustrating delay paths in the variable delay circuit. In these figures, reference numeral 1 designates a variable delay circuit, and numeral 11 designates a control circuit outputting a plurality of control signals PE, D0, D1, and D2. Reference numeral 12 designates a single-stage unit delay circuit comprising two two-input NOR circuits, i.e., a two-input NOR circuit C and a two-input NOR circuit D. Four stages of unit delay circuits are constructed by eight two-input NOR circuits A, B, C, D, E, F, G, and H, so that this variable delay circuit can control the delay time in four stages.

As shown by the unit delay circuit 12, in each unit delay circuit, the two-input NOR circuits are connected so that an output from the first two-input NOR circuit (D in the circuit 12) to which an input signal $\overline{IN}$ is applied is input to one of the two input terminals of the second two-input NOR circuit (C in the circuit 12) which is nearer to the delay output $\overline{DLY}$ than the first two-input NOR circuit, and a control signal from the control circuit 11 is input to the other input terminal of the second two-input NOR circuit.

A description is given of the operation principle. Table 1 shows combinations of control signals output from the control circuit 11.

TABLE 1

|   | D2 | D1 | D0 | PE |
|---|----|----|----|-----|
| A | x  | x  | 1  | 0   |
| B | x  | 1  | 0  | 0   |
| C | 1  | 0  | 0  | 0   |
| D | 0  | 0  | 0  | 0   |
| E | x  | x  | x  | 1   |

When the control signals output from the control circuit 11 are as shown by A in table 1, since, as is well known, a NOR circuit outputs 1 (High) when both of its two inputs are 0 (Low), the two-input NOR circuit C shown in FIG. 1(a) outputs "Low", and the input signal $\overline{IN}$ travels through the two two-input NOR circuits A and B and is output as the delay output $\overline{DLY}$. Hence, when the delay time of one two-input NOR circuit is $1_{tdi}$, the delay time due to these two NOR circuits A and B is given by $2_{tdi}$, and this delay time corresponds to the transmission path P1 shown by two arrows in the schematic diagram 1(b) and is the shortest delay time. FIG. 1(c) shows waveforms of the input signal $\overline{IN}$ and the delay output $\overline{DLY}$ at this time.

Further, when the combination of control signals output from the control circuit 11 is as shown by B in table 1, the two-input NOR circuit E shown in FIG. 1(a) outputs "Low", and the two-input NOR circuit C outputs "High". As a result, the input signal $\overline{IN}$ travels through the four two-input NOR circuits D, C, B, and A and is output as the delay output $\overline{DLY}$, and the delay time is given by $4 \cdot t_{di2}$. This delay time corresponds to the transmission path P2 shown by four arrows in the schematic diagram 1(b), and it is longer by the delay time of two of the two-input NOR circuits than the delay time in the case of A in the above truth table.

Thereafter, in similar manner, the control signals from the control circuit 11 are input as shown by C and D in table 1, whereby four stages of delay times, in total, can be made using the variable delay circuit. The transmission paths P1 and P2 are not completely parallel (separated) paths, but pass through the same line in the two-input NOR circuit A shown in FIG. 1(a). Therefore, when the variation in delay time of each element is Δt, the variation in delay time per unit resolution becomes 4×Δt, and this is ⅔ of the variation, 6×Δt, in the conventional variable delay circuit.

As described above, according to the first embodiment of the present invention, a plurality of delay circuits 12, each comprising first and second two-input NOR circuits connected in series, are connected in series at the first input terminals of the two-input NOR circuits, and the input signal $\overline{IN}$ is applied to the second input terminals of the first two-input NOR circuits B, D, F, and H while the control signals from the control circuit 11 are respectively applied to the second input terminals of the second two-input NOR circuits A, C, E, and G, whereby the delay time in the signal transmission from the input signal $\overline{IN}$ to the delay output $\overline{DLY}$ is varied with the control signals. Therefore, the number of elements per unit resolution is reduced, and variations in delay time are reduced by the reduced element number, whereby the linearity of the delay circuit is improved. Further, the layout is simplified as compared with the conventional delay circuit.

Embodiment 2

Figure 2:
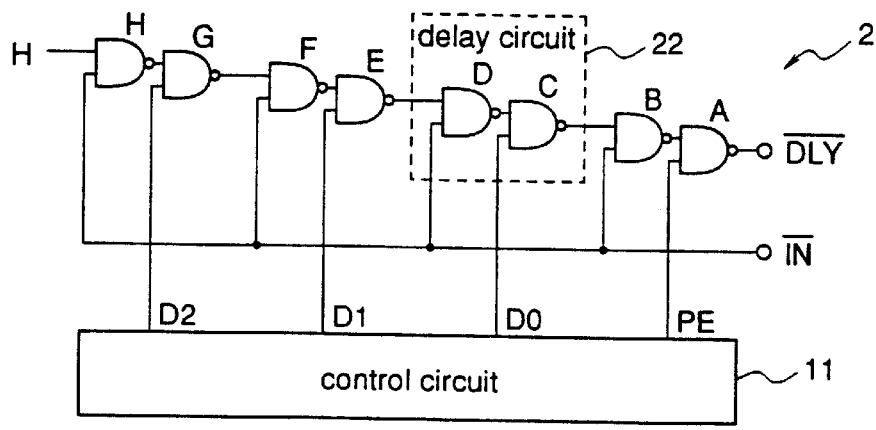
FIG. 2 is a logical circuit diagram illustrating a variable delay circuit as a semiconductor device according to a second embodiment of the invention.

FIG. 2 is a logical circuit diagram illustrating a variable delay circuit as a semiconductor device according to a second embodiment of the invention. In FIG. 2, the same reference numerals as those shown in FIG. 1(a) designate the same or corresponding parts. Reference numeral 2 designates a variable delay circuit according to this second embodiment, and numeral 22 designates a single-stage unit delay circuit comprising two two-input NAND circuits, i.e., a two-input NAND circuit C and a two-input NAND circuit D. Four stages of unit delay circuits are constructed by eight two-input NAND circuits A, B, C, D, E, F, G, and H, so that this variable delay circuit can control the delay time in four stages.

As shown by the unit delay circuit 22, in each unit delay circuit, the two-input NAND circuits are connected so that an output from the first two-input NAND circuit (D in the circuit 22) to which the input signal $\overline{IN}$ is applied is input to one of the two input terminals of the second two-input NAND circuit (C in the circuit 22) which is nearer to the delay output $\overline{DLY}$ than the first two-input NAND circuit, and the control signal from the control circuit 11 is input to the other input terminal of the second two-input NAND circuit. That is, in this second embodiment, the two-input NOR circuits of each unit delay circuit 12 according to the first embodiment are replaced with the two-input NAND circuits. For the output signals from the control circuit 11, the negative logic of table 1 is employed as shown in table 2.

TABLE 2

|   | D2 | D1 | D0 | PE |
|---|----|----|----|-----|
| A | x  | x  | 0  | 1   |
| B | x  | 0  | 1  | 1   |
| C | 0  | 1  | 1  | 1   |
| D | 1  | 1  | 1  | 1   |
| E | x  | x  | x  | 0   |

When the combination of the control signals output from the control circuit 11 is as shown by A in table 2, since, as it is well known, a NAND circuit outputs 0 (Low) when both of its two inputs are 1 (High), the two-input NAND circuit C shown in FIG. 2 outputs "High", and the input signal $\overline{IN}$ travels through the two two-input NAND circuits A and B and is output as the delay output $\overline{DLY}$. Hence, when the delay time of one two-input NAND circuit is $1_{tdi}$ the delay time due to the two NAND circuits A and B is given by $2_{tdi}$, and this delay time corresponds to the transmission path P1 shown by two arrows in the schematic diagram 1(b) and is the shortest delay time.

Further, when the combination of the control signals from the control circuit 11 is as shown by B in table 2, the two-input NAND circuit E shown in FIG. 2 outputs "High", and the two-input NAND circuit C outputs "Low". As a result, the input signal $\overline{IN}$ travels through the four two-input NAND circuits D, C, B, and A and is output as the delay output DLY, and the delay time is given by $4 \cdot t_{di2}$.

This delay time corresponds to the transmission path P2 shown by four arrows in the schematic diagram 1(b), and it is longer by the delay time of two two-input NAND circuits than the delay time in the case of A in table 2.

As described above, in this second embodiment of the present invention, in place of the two-input NOR circuits of the unit delay circuits 12 employed in the first embodiment, two-input NAND circuits are employed in the unit delay circuits 22. Therefore, as in the first embodiment, the number of elements per unit resolution is reduced, and variations in delay time are reduced with the reduction in the element number, whereby the linearity of the delay circuit is improved. Further, the layout is simplified as compared with the conventional delay circuit.

Embodiment 3

Figure 3:
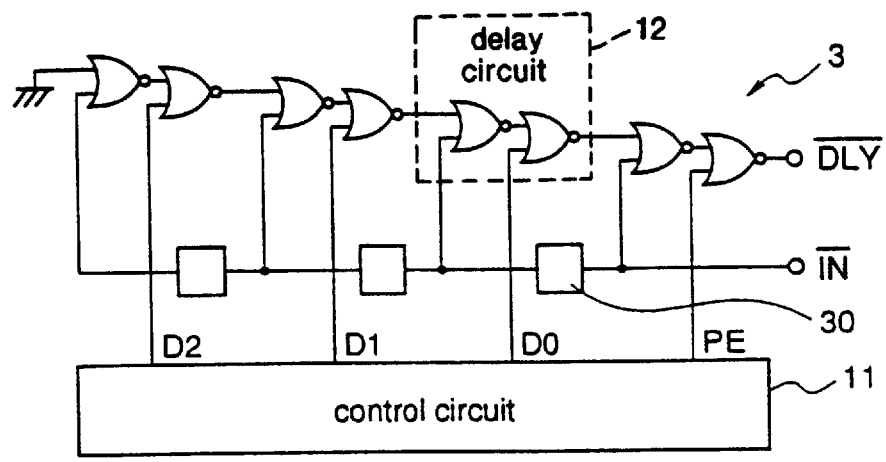
FIG. 3(a) is a logical circuit diagram illustrating a variable delay circuit as a semiconductor device according to a third embodiment of the invention.
FIG. 3(b) is a diagram showing waveforms of an input signal and delay outputs.
FIG. 3(c) is a diagram showing characteristics of the variable delay circuit.
Figure 3:
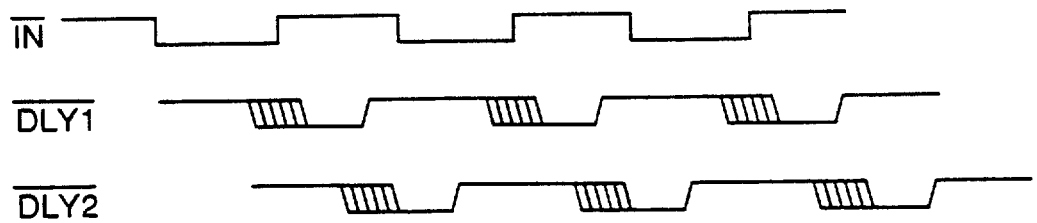
Figure 3:
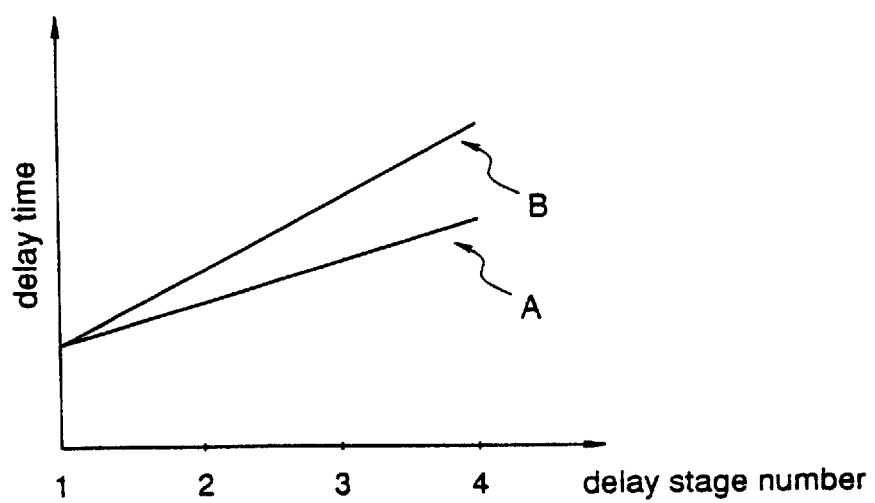

FIG. 3(a) is a logical circuit diagram illustrating a variable delay circuit as a semiconductor device according to a third embodiment of the present invention. In FIG. 3(a), the same reference numerals as those shown in FIG. 1(a) designate the same or corresponding parts. Reference numeral 3 designates a variable delay circuit according to this third embodiment. In the variable delay circuit 3, among the unit delay circuits 12, one nearest to the delay output DLY, i.e., one having the shortest delay path, is connected to the input $\overline{IN}$, and delay elements 30 are inserted between $\overline{IN}$ input nodes of the respective unit delay circuits 12.

As described above, according to the third embodiment of the invention, in addition to the circuit structure according to the first embodiment, the delay elements 30 are inserted in the input signal $\overline{IN}$ transmitting path as shown in FIG. 3(a). Therefore, although the resolution is determined by performance of the unit delay circuit 12 in the variable delay circuit according to the first embodiment, since the delay elements 30 are inserted as shown in FIG. 3(a) in the variable delay circuit according to this third embodiment, as shown in FIG. 3(b), the rising edge of the delay output $\overline{DLY}_1$ via a single-stage delay circuit is delayed in comparison with the input signal $\overline{IN}$, as compared with that shown in FIG. 1(c). More specifically, since the delay time due to delay of the single-stage delay circuit is increased, the resolution as a delay circuit is reduced, and, utilizing this fact, a desired resolution is obtained, whereby a variable delay circuit having characteristics shown in FIG. 3(c) is realized. This variable delay circuit has a high resistance to variations in the elements, an excellent linearity, and a resolution lower than the resolution of the unit delay circuit 12 regardless of the resolution of the unit delay circuit.

Embodiment 4

Figure 4:
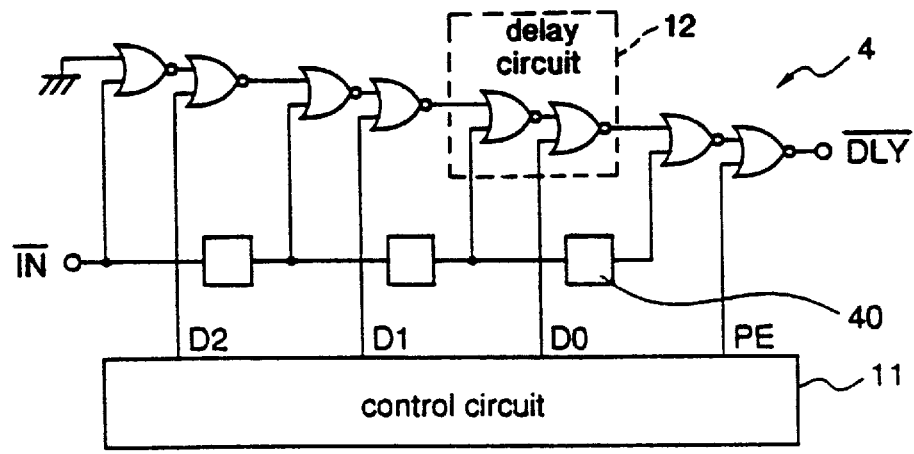
FIG. 4(a) is a logical circuit diagram illustrating a variable delay circuit as a semiconductor device according to a fourth embodiment of the invention.
FIG. 4(b) is a diagram showing waveforms of an input signal and delay outputs.
FIG. 4(c) is a diagram showing characteristics of the variable delay circuit.
Figure 4:
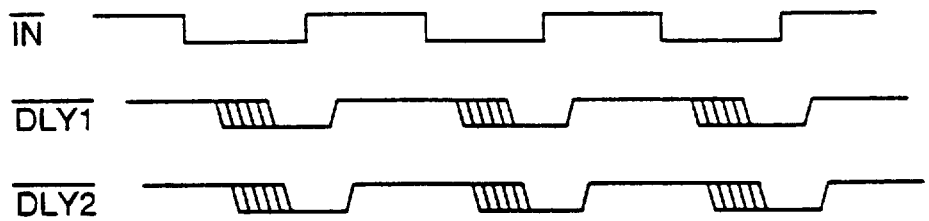
Figure 4:
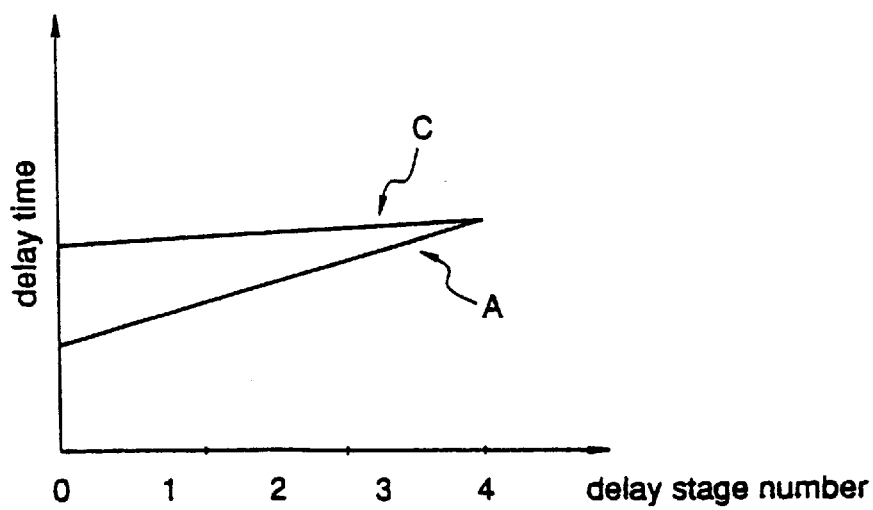

FIG. 4(a) is a logical circuit diagram illustrating a variable delay circuit as a semiconductor device according to a fourth embodiment of the present invention. In FIG. 4(a), the same reference numerals as those shown in FIG. 1 designate the same or corresponding parts. Reference numeral 4 designates a variable delay circuit according to this fourth embodiment. In the variable delay circuit, among the unit delay circuits 12, one most distant from the delay output $\overline{DLY}$, i.e., one having the longest delay path, is connected to the input $\overline{IN}$, and delay elements 40 are inserted between $\overline{IN}$ input nodes of the respective unit delay circuits 12. In the variable delay circuit so constructed, with respect to adjacent first (previous) and second (subsequent) unit delay circuits 12, a difference between the time during which the input signal $\overline{IN}$ is input to one of two input terminals of the second unit delay circuit and the time during which the signal output from the first unit delay circuit 12 is input to the other input terminal of the second unit delay circuit is reduced. As a result, the delay time due to each unit delay circuit 12 is reduced, whereby the resolution as a variable delay circuit is improved.

As described above, according to the fourth embodiment of the invention, the input signal $\overline{IN}$ is input from the unit delay circuit having the longest delay path, and the delay elements 40 are inserted in the input signal $\overline{IN}$ transmitting path as shown in FIG. 4(a). Therefore, as shown in FIG. 4(b), the rising edge of the delay output $\overline{DLY}_1$ via a single-stage delay circuit is advanced in comparison with the input signal $\overline{IN}$, as compared with that shown in FIG. 1(c). More specifically, since the delay time due to delay of the single-stage delay circuit is increased, the resolution as a delay circuit is reduced, and utilizing this fact, a desired resolution is obtained, whereby a variable delay circuit having characteristics shown in FIG. 4(c) is realized. This variable delay circuit has a high resistance to variations in the elements, an excellent linearity, and a resolution lower than the resolution of the unit delay circuit 12 regardless of the resolution of the unit delay circuit.

Figure 5:
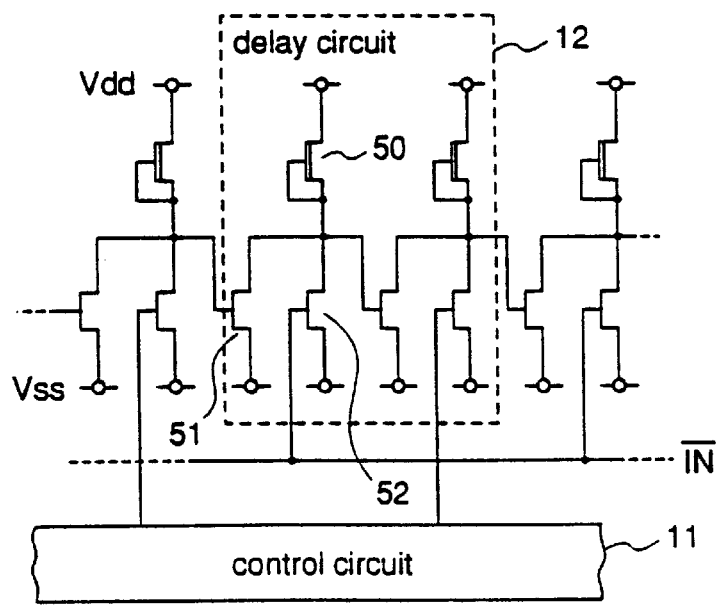
FIG. 5 is a diagram illustrating a unit delay circuit when a unit delay circuit constituting a variable delay circuit according to any of first, third, and fourth embodiments is implemented using DCFL (Direct Coupled FET Logic).

FIG. 5 is a circuit diagram illustrating, in detail, a unit delay circuit 12 constructed using DCFL (Direct Coupled FET Logic), included in the variable delay circuit according to any of first, third, and fourth embodiments of the invention. As shown in FIG. 5, a single-stage unit delay circuit 12 comprises two single-stage NOR gates connected in series, and each NOR gate comprises a load transistor 50 connected to a power supply $V_{dd}$, and two transistors 51 and 52 which are connected in parallel between an output node of the load transistor 50 and a power supply $V_{SS}$. A resolution of about 100 psec can be expected as a practical circuit.

Since the variable delay circuit is usually constructed on a GaAs substrate, when DCFL is employed as shown in FIG. 5, the power consumption is reduced.

Figure 6:
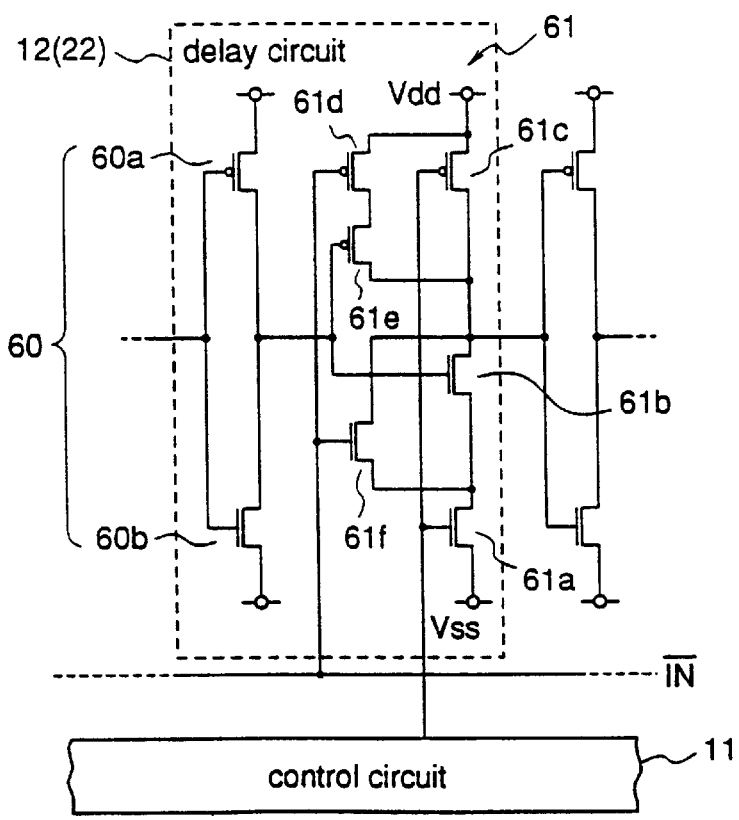
FIG. 6 is a diagram illustrating a unit delay circuit when a unit delay circuit constituting a variable delay circuit according to any of first to fourth embodiments is implemented using a CMOS (Complementary Metal Oxide Semiconductor) circuit.

Further, FIG. 6 is a circuit diagram illustrating, in detail, a unit delay circuit 12 (22) constructed using a CMOS (Complementary Metal Oxide Semiconductor) circuit, included in a variable delay circuit according to any of first to fourth embodiments. As shown in FIG. 6, a single-stage unit delay circuit 12 (22) comprises an inverter 60 which comprises a pair of transistors, a p-MOS transistor 60a and an n-MOS transistor 60b connected in series between a power supply $V_{dd}$ and a power supply $V_{ss}$, and a NOR gate 61 connected to an output node of the inverter 60.

The NOR gate 61 comprises a p-MOS transistor 61c, an n-MOS transistor 61b, and an n-MOS transistor 61a which are connected in series between the power supply $V_{dd}$ and the power supply $V_{ss}$, a p-MOS transistor 61d and a p-MOS transistor 61e which are connected in parallel with the p-MOS transistor 61c, and an n-MOS transistor 61f which is connected in parallel with the n-MOS transistor 61b. A resolution of 1–10 nsec can be expected as a practical circuit.

Figure 7:
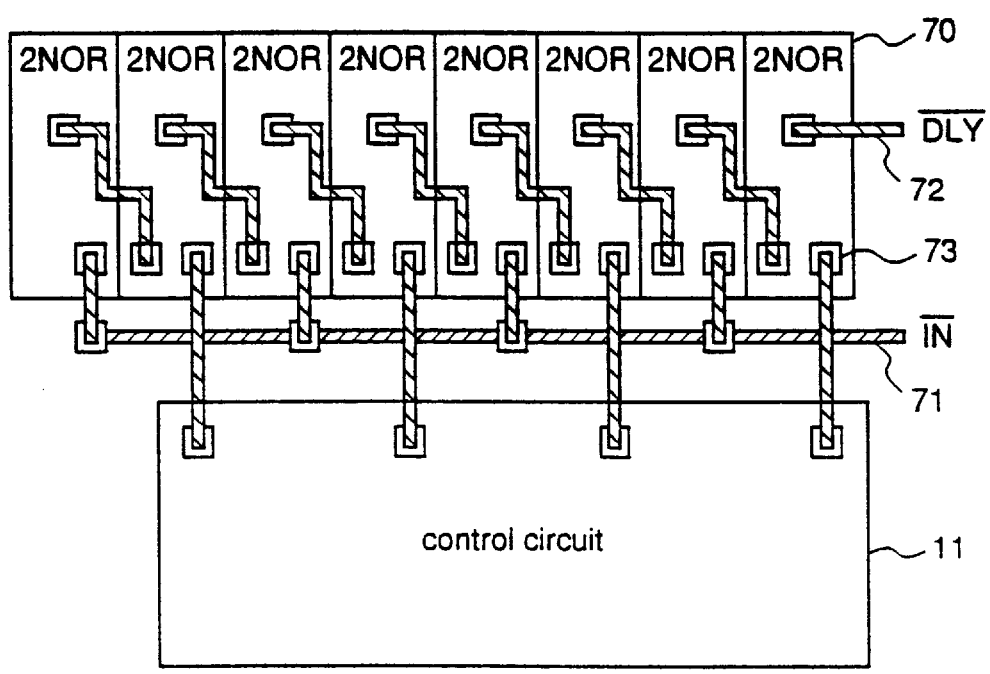
FIG. 7 is a diagram illustrating a layout pattern on a substrate of a variable delay circuit according to any of first to fourth embodiments.

FIG. 7 is a diagram showing a layout pattern when a variable delay circuit according to any of the first to fourth embodiments is arranged on a substrate. In FIG. 7, reference numeral 70 designates two-input NOR (or NAND) gates, numeral 71 designates a first wiring layer serving as an input terminal $\overline{IN}$, numeral 72 designates a second wiring layer serving as a wiring connecting a delay output $\overline{DLY}$ with the two-input NOR gates 70, and as a wiring connecting the first wiring layer 71 with the two-input NOR gates 70. Further, an insulating film is disposed between the first wiring layer 71 and the second wiring layer 72, and these wiring layers 71 and 72 are connected to through contact holes 73.

As shown in FIG. 7, the respective cells of the two-input NOR (NAND) gates 70 are arranged adjacent to each other without leaving spaces between them, and an output terminal of each cell is connected to an input terminal of the next cell, with the shortest wiring. Since the first wiring layer 71 serving as an input terminal $\overline{IN}$ is connected to the input terminals of the respective cells 70 in good order, there is no deviation in input timing due to the wiring. Further, since the first wiring layer 71 serving as an input terminal $\overline{IN}$ and the second wiring layer 72 connected to the output terminal of each cell 70 do not cross each other, there is no generation of noise due to crossing of the wiring. This layout realizes a small-area variable delay circuit which is excellent in resolution, resistance to variations in the elements, and linearity.

Embodiment 5

Figure 8:
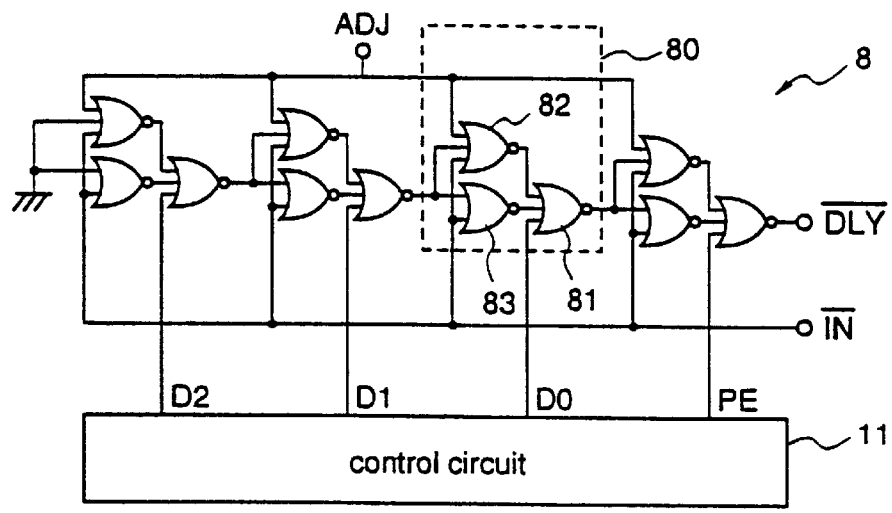
FIGS. 8(a) is a logical circuit diagram illustrating a variable delay circuit as a semiconductor device according to a fifth embodiment of the invention.
FIG. 8(b) is a diagram illustrating a part of the logical circuit in FET level.
Figure 8:
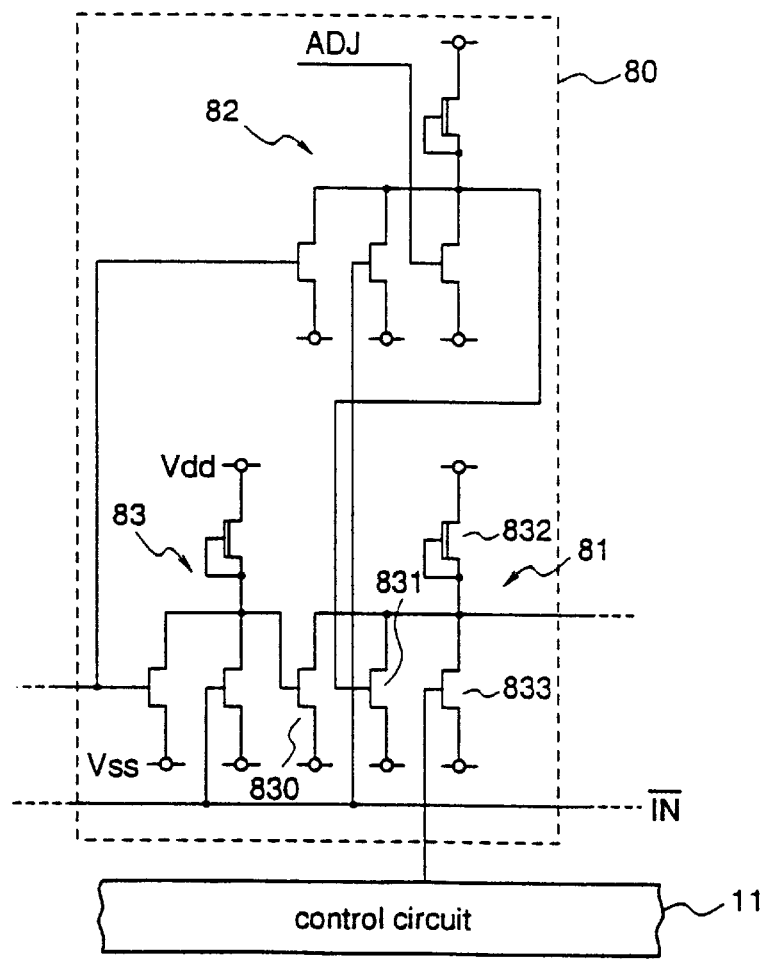

FIG. 8(a) is a logical circuit diagram showing a variable delay circuit as a semiconductor device according to a fifth embodiment of the present invention. In FIG. 8(a), the same reference numerals as those shown in FIG. 1(a) designate the same or corresponding parts. Reference numeral 8 designates a variable delay circuit according to this fifth embodiment. In this fifth embodiment, in the structure of the variable delay circuit according to the first embodiment, the second (subsequent) one of the two two-input NOR circuits constituting the unit delay circuit is replaced with a three-input NOR circuit 81. Further, a three-input NOR circuit 82, to which an input signal $\overline{\text{IN}}$, an output from the previous unit delay circuit, and a control signal ADJ for adjusting the delay time are input, is connected in parallel with a two-input NOR circuit 83.

By applying the control signal ADJ, for adjusting the delay time, to the three-input NOR circuit 82, the driving ability of transistors constituting the three-input NOR 81 in the output stage of each unit delay circuit 80 can be varied, whereby the resolution of the variable delay circuit can be varied from the outside.

For example, when "High" is applied as the control signal ADJ, in the circuit diagram shown in FIG. 8(b), the n-MOS transistor included in the second-stage three-input NOR circuit 81 is turned off, so that the three-input NOR circuit 81 operates substantially as a two-input NOR circuit.

On the other hand, when "Low" is applied as the control signal ADJ, in the circuit diagram shown in FIG. 8(b), the n-MOS transistor included in the second-stage three-input NOR circuit 81 is turned on and operates together with the n-MOS transistor 830, which is connected in series to the NOR circuit 81, so that the ability to drive the second-stage drive transistors 832 and 833 is increased, with a result that the resolution is increased as shown in FIG. 4(c).

As described above, according to the fifth embodiment of the present invention, N (N=integer) unit delay circuits 80, each comprising a two-input NOR circuit 83, a first three-input NOR circuit 82, and a second three-input NOR circuit 81, are connected in series. In each unit delay circuit, output terminals of the two-input NOR circuit 83 and the first three-input NOR circuit 82 are connected to two inputs of the second three-input NOR circuit 81, respectively, a control signal ADJ for adjusting the delay time is applied to an input terminal of the first three-input NOR circuit 82, an input signal $\overline{\text{IN}}$ is applied to an input terminal of the two-input NOR circuit 83 and to one of remaining two input terminals of the three-input NOR circuit 82, a control signal output from the control circuit 11 is applied to the remaining input terminal of the three-input NOR circuit 81, and the delay time in signal transmission from the input $\overline{\text{IN}}$ to the output $\overline{\text{DLY}}$ is varied by the control signals. Therefore, even when the elements of the variable delay circuit vary, these variations can be adjusted with the signal ADJ supplied from the outside, whereby the production yield of the variable delay circuit is improved.

While in this fifth embodiment the same control signal ADJ for adjusting the delay time is applied to all the unit delay circuits 80, different ADJ signals may be applied to the respective unit delay circuits 80. In this case, the delay time in each unit delay circuit can be varied intentionally, whereby a variable delay circuit having non-linear delay characteristics is realized.

Embodiment 6

Figure 9:
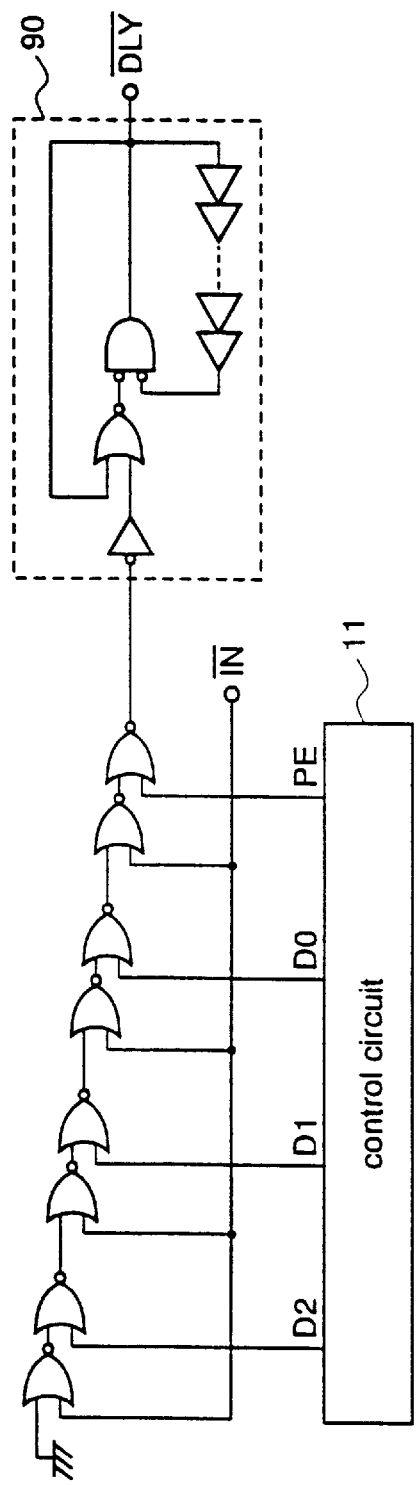
FIG. 9 is a logical circuit diagram illustrating a variable delay circuit as a semiconductor device according to a sixth embodiment of the present invention.

FIG. 9 is a logical circuit diagram illustrating a variable delay circuit as a semiconductor device according to a sixth embodiment of the present invention. In FIG. 9, the same reference numerals as those shown in FIG. 1(a) designate the same or corresponding parts. Reference numeral 90 designates a pulse generating circuit included in variable delay circuit.

When a plurality of unit delay circuits are connected series and the delay time is varied according to the number of stages of each unit delay circuit as described in first to fifth embodiments of the invention, the pulse width increases with an increase in the number of the delay stages.

In this sixth embodiment, the pulse generating circuit having the structure shown in FIG. 9 is connected to output stage of the variable delay circuit, and the waveform of the output signal from the circuit is corrected, whereby the pulse width of the output pulse is made uniform, resulting in a stable output.

What is claimed is:

1. A semiconductor device comprising:

an input terminal and an output terminal;

a delay circuit comprising N (N=integer) unit delay circuits connected in series between the input terminal and the output terminal, each unit delay circuit comprising first and second two-input NOR circuits connected in series, the second two-input NOR circuit being electrically nearer the output terminal than the first two-input NOR circuit, a first input of each first two-input NOR circuit being connected to the input terminal, an output of each first two-input NOR circuit being connected to a first input of the second two-input NOR circuit of the respective unit delay circuit, and outputs of N−1 of the second two-input NOR circuits being connected to a second input of the first two-input NOR circuit of a respective subsequent unit delay circuit, an output of the Nth second two-input NOR circuit being the output terminal; and a control circuit outputting individual control signals, each control signal being applied to a second input of the second two-input NOR circuit of a respective unit delay circuit, wherein delay time in signal transmission from the input terminal to the output terminal varies in response to the control signals.

2. A semiconductor device comprising:

an input terminal and an output terminal;

a delay circuit comprising N (N=integer) unit delay circuits connected in series between the input terminal and the output terminal, each unit delay circuit comprising first and second two-input NAND circuits connected in series, the second two-input NAND circuit being electrically nearer the output terminal than the first two-input NAND circuit, a first input of each first two-input NAND circuit being connected to the input terminal, an output of each first two-input NAND circuit being connected to a first input of the second two-input NAND circuit of the respective unit delay circuit, and outputs of N−1 of the second two-input NAND circuits being connected to a second input of the first two-input NAND circuit of a respective subsequent unit delay circuit, an output of the Nth second two-input NAND circuit being the output terminal; and a control circuit outputting individual control signals, each control signal being applied to a second input of the second two-input NAND circuit of a respective unit delay circuit, wherein delay time in signal transmission from the input terminal to the output terminal varies in response to the control signals.

3. The semiconductor device of claim 1 including a delay element inserted in a signal transmission path between the first inputs of the first two-input NOR circuits of adjacent unit delay circuits and wherein an input signal from the input terminal is applied to the unit delay circuits connected in series, from the unit delay circuit nearest to the output terminal toward the unit delay circuit most distant from the output terminal, whereby the delay time due to the unit delay circuits is increased.

4. The semiconductor device of claim 1 including a delay element inserted in a signal transmission path between the first inputs of the first two-input NOR circuits of adjacent unit delay circuits and wherein an input signal from the input terminal is applied to the unit delay circuits connected in series, from the unit delay circuit most distant from the output terminal toward the unit delay circuit nearest to the output terminal, whereby the delay time due to the unit delay circuits is decreased.

5. The semiconductor device of claim 1 wherein each two-input NOR circuit is constituted using direct coupled FET logic (DCFL).

6. The semiconductor device of claim 1 wherein each two-input NOR circuit is constituted by one of an N-channel MOS circuit and a complementary MOS circuit.

7. The semiconductor device of claim 2 wherein each two-input NAND circuit is constituted by one of an N-channel MOS circuit and a complementary MOS circuit.

8. The semiconductor device of claim 1 wherein the first and second two-input NOR circuits connected in series are arranged as respective cells on a semiconductor substrate and the cells are arranged adjacent to each other in a line as the delay circuit.

9. The semiconductor device of claim 2 wherein the first and second two-input NAND circuits connected in series are arranged as respective cells on a semiconductor substrate and the cells are arranged adjacent to each other in a line as the delay circuit.

10. A semiconductor device comprising:
an input terminal and an output terminal;
a delay circuit comprising N (N=integer) unit delay circuits connected in series between the input terminal and the output terminal, each unit delay circuit comprising a two-input NOR circuit, a first three-input NOR circuit, and a second three-input NOR circuit being connected so that a first input of the two-input NOR circuit and a first input of the first three-input NOR circuit are connected to the input terminal, output terminals of the two-input NOR circuit and the first three-input NOR circuit are respectively connected to first and second inputs of the second three-input NOR circuit, the unit delay circuits being connected so that an output of the second three-input NOR circuit of a unit delay circuit is connected to a second input of the two-input NOR circuit and a second input of the first three-input NOR circuit of a subsequent unit delay circuit; and
a control circuit outputting individual control signals, each control signal being applied to a respective third input of the second three-input NOR circuit of each unit delay circuit, wherein a delay time in signal transmission from the input terminal to the output terminal varies in response to the control signals, and a delay time due to each unit delay circuit varies in response to an adjusting signal input to a third input of the first three-input NOR circuit of each unit delay circuit, whereby resolution of the delay circuit is varied.

11. The semiconductor device of claim 1 further comprising pulse width formation means connected to the out-put terminal for making uniform a pulse width output from the output terminal.

* * * * *